United States Patent
Wang et al.

(10) Patent No.: US 9,773,567 B1
(45) Date of Patent: Sep. 26, 2017

(54) REDUCED SILICON-OXIDE-NITRIDE-OXIDE-SILICON (SONOS) FLASH MEMORY PROGRAM DISTURB

(71) Applicant: QUALCOMM Incorporated, San Diego, CA (US)

(72) Inventors: Zhongze Wang, San Diego, CA (US); Guoqing Chen, San Diego, CA (US); Paul Hoayun, Cambridge (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/439,086

(22) Filed: Feb. 22, 2017

(51) Int. Cl.
  *G11C 16/10* (2006.01)
  *G11C 16/34* (2006.01)

(52) U.S. Cl.
  CPC .......... *G11C 16/3427* (2013.01); *G11C 16/10* (2013.01); *G11C 16/3422* (2013.01)

(58) Field of Classification Search
  CPC ..... G11C 16/10; G11C 16/06; G11C 16/3418; G11C 16/3421; G11C 16/3422; G11C 16/3427
  USPC .......................... 365/185.02, 185.18, 185.28
  See application file for complete search history.

(56) References Cited

U.S. PATENT DOCUMENTS

| | | | |
|---|---|---|---|
| 7,023,739 B2 | 4/2006 | Chen et al. | |
| 7,433,233 B2 | 10/2008 | Chen et al. | |
| 8,125,835 B2 | 2/2012 | Hirose et al. | |
| 8,233,320 B2 * | 7/2012 | Lee | G11C 16/0425 365/185.03 |
| 8,675,405 B1 | 3/2014 | Georgescu et al. | |
| 8,953,381 B2 * | 2/2015 | Leem | G11C 7/00 365/185.17 |
| 9,025,375 B2 | 5/2015 | Chang et al. | |
| 2004/0145024 A1 * | 7/2004 | Chen | G11C 16/0483 257/390 |
| 2010/0097863 A1 * | 4/2010 | Kim | G11C 11/5628 365/185.18 |

* cited by examiner

*Primary Examiner* — Tan T. Nguyen
(74) *Attorney, Agent, or Firm* — Toler Law Group, Inc.

(57) ABSTRACT

A method and apparatus for balancing voltage stress at a silicon-oxide-nitride-oxide-silicon (SONOS) flash memory array is disclosed. A particular cell of the SONOS flash memory array is selected for programming. A first voltage stress associated with a first SONOS transistor is determined if the particular cell is programmed. The first SONOS transistor is included in a first unselected cell of the SONOS flash memory array. A second voltage stress associated with a second SONOS transistor is determined if the particular cell is programmed. The first voltage stress and the second voltage stress are balanced prior to programming the particular cell.

20 Claims, 6 Drawing Sheets

REDUCED SILICON-OXIDE-NITRIDE-OXIDE-SILICON (SONOS) FLASH MEMORY PROGRAM DISTURB

I. FIELD

The present disclosure is generally related to an innovative methodology to reduce silicon-oxide-nitride-oxide-silicon (SONOS) flash memory program disturb.

II. DESCRIPTION OF RELATED ART

Advances in technology have resulted in smaller and more powerful computing devices. For example, there currently exist a variety of portable personal computing devices, including wireless computing devices, such as portable wireless telephones and smart watches, and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A wireless device (e.g., a wireless telephone) may include an array of silicon-oxide-nitride-oxide-silicon (SONOS) flash memory cells. A processor may select a particular SONOS memory cell to be programmed, and the other SONOS memory cells may be unselected for programming operations. However, voltages may be applied to SONOS transistors of the unselected SONOS memory cells while the particular SONOS memory cell is programmed. As a result, the SONOS transistors in the unselected SONOS memory cells may experience program disturb. For example, voltages may be applied to gates of the SONOS transistors in the unselected SONOS memory cells via gate lines (e.g., word lines) and voltages may be applied to drains of the SONOS transistors in the unselected SONOS memory cells via bit lines. A voltage difference between the gate and drain of a SONOS transistor in an unselected SONOS memory cell may result in voltage stress across the SONOS transistor. The voltage stress may cause the unselected SONOS memory cell to experience program disturb. For example, the voltage stress may cause the unselected SONOS memory cell to be inadvertently programmed.

III. SUMMARY

According to one implementation of the techniques disclosed herein, a method of balancing voltage stress at a silicon-oxide-nitride-oxide-silicon (SONOS) flash memory array includes selecting, at a processor, a particular cell of the SONOS flash memory array for programming. The method also includes determining a first voltage stress associated with a first SONOS transistor if the particular cell is programmed. The first SONOS transistor is included in a first unselected cell of the SONOS flash memory array. The first unselected cell and the particular cell are coupled to a common word line. The method further includes determining a second voltage stress associated with a second SONOS transistor if the particular cell is programmed. The second SONOS transistor is included in a second unselected cell of the SONOS flash memory array, and the second unselected cell and the particular cell are coupled to a common bit line. The method also includes determining a third voltage stress associated with a third SONOS transistor if the particular cell is programmed. The third SONOS transistor is included in a third unselected cell of the SONOS flash memory array. The method further includes balancing the first voltage stress, the second voltage stress, and the third voltage stress prior to programming the particular cell to enable the SONOS flash memory array to be programmed according to a sub-page program mode.

According to another implementation of the techniques disclosed herein, an apparatus for balancing voltage stress at a silicon-oxide-nitride-oxide-silicon (SONOS) flash memory array includes a processor and a memory storing instructions that are executable by the processor to perform operations. The operations include selecting a particular cell of the SONOS flash memory array for programming. The operations also include determining a first voltage stress associated with a first SONOS transistor if the particular cell is programmed. The first SONOS transistor is included in a first unselected cell of the SONOS flash memory array. The first unselected cell and the particular cell are coupled to a common word line. The operations also include determining a second voltage stress associated with a second SONOS transistor if the particular cell is programmed. The second SONOS transistor is included in a second unselected cell of the SONOS flash memory array, and the second unselected cell and the particular cell are coupled to a common bit line. The operations also include determining a third voltage stress associated with a third SONOS transistor if the particular cell is programmed. The third SONOS transistor is included in a third unselected cell of the SONOS flash memory array. The operations further include balancing the first voltage stress, the second voltage stress, and the third voltage stress prior to programming the particular cell to enable the SONOS flash memory array to be programmed according to a sub-page program mode.

According to another implementation of the techniques disclosed herein, a non-transitory computer-readable medium includes instructions for balancing voltage stress at a silicon-oxide-nitride-oxide-silicon (SONOS) flash memory. The instructions, when executed by a processor, cause the processor to perform operations including selecting a particular cell of the SONOS flash memory array for programming. The operations also include determining a first voltage stress associated with a first SONOS transistor if the particular cell is programmed. The first SONOS transistor is included in a first unselected cell of the SONOS flash memory array. The first unselected cell and the particular cell are coupled to a common word line. The operations also include determining a second voltage stress associated with a second SONOS transistor if the particular cell is programmed. The second SONOS transistor is included in a second unselected cell of the SONOS flash memory array, and the second unselected cell and the particular cell are coupled to a common bit line. The operations also include determining a third voltage stress associated with a third SONOS transistor if the particular cell is programmed. The third SONOS transistor is included in a third unselected cell of the SONOS flash memory array. The operations further include balancing the first voltage stress, the second voltage stress, and the third voltage stress prior to programming the particular cell to enable the SONOS flash memory array to be programmed according to a sub-page program mode.

IV. BRIEF DESCRIPTION OF THE DRAWINGS

V. DETAILED DESCRIPTION

Figure 1:
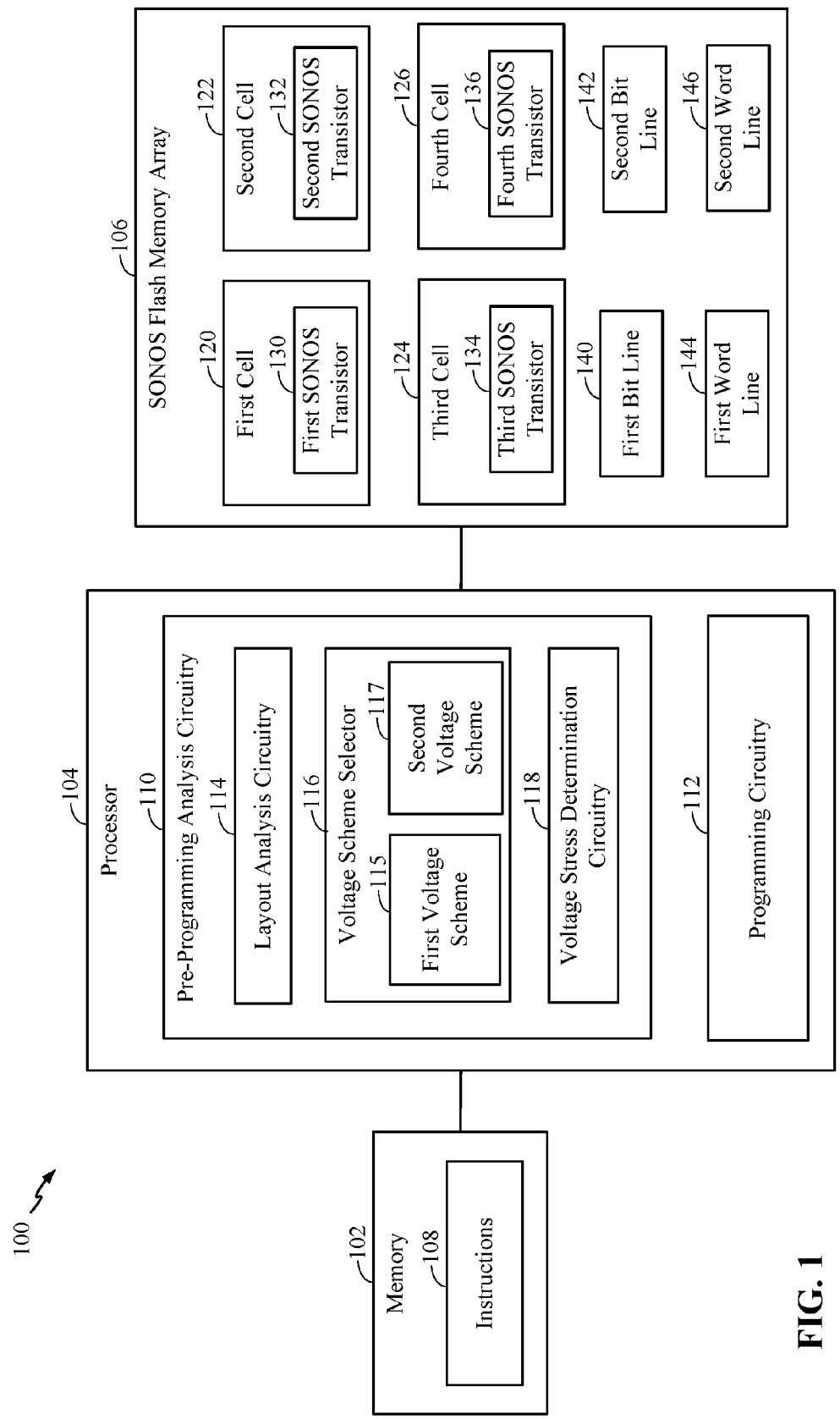
FIG. 1 illustrates a particular example of a system that is operable to balance voltage stress at a silicon-oxide-nitride-oxide-silicon (SONOS) flash memory.

Referring to FIG. 1, a system 100 that is operable to balance voltage stress at a silicon-oxide-nitride-silicon (SONOS) flash memory is shown. The system 100 includes a memory 102, a processor 104, and a SONOS flash memory array 106. According to one implementation, the SONOS flash memory array 106 may be a SONOS embedded-flash (eFlash) memory array. The memory 102 is coupled to the processor 104, and the processor 104 is coupled to the SONOS flash memory array 106.

The memory 102 includes instructions 108 that are executable by one or more components of the processor 104 to perform the techniques described herein. According to one implementation, the memory 102 includes a non-transitory computer-readable medium. The processor 104 includes pre-programming analysis circuitry 110 and programming circuitry 112. The pre-programming analysis circuitry 110 includes layout analysis circuitry 114, a voltage scheme selector 116, and voltage stress determination circuitry 118.

The SONOS flash memory array 106 includes a plurality of cells. For example, the SONOS flash memory array 106 includes a first cell 120, a second cell 122, a third cell 124, and a fourth cell 126. The first cell 120 includes a first SONOS transistor 130, the second cell 120 includes a second SONOS transistor 132, the third cell 124 includes a third SONOS transistor 134, and the fourth cell 126 includes a fourth SONOS transistor 136. The SONOS flash memory array 106 also includes a first bit line 140 associated with a first column of the SONOS flash memory array 106, a second bit line 142 associated with a second column of the SONOS flash memory array 106, a first word line 144 associated with a first row of the SONOS flash memory array 106, and a second word line 146 associated with a second row of the SONOS flash memory array 106. The first column may be adjacent to the second column, and the first row may be adjacent to the second row. In other implementations, the SONOS flash memory array 106 may include additional cells, additional word lines, and additional bit lines. For example, the SONOS flash memory array 106 may include more than four cells, more than two word lines, and more than two bit lines.

The first cell 120 and the third cell 124 may be located in the first column, and the second cell 122 and the fourth cell 126 may be located in the second column. For example, the first bit line 140 may be coupled to a drain of the first SONOS transistor 130 and to a drain of the third SONOS transistor 134. In a similar manner, the second bit line 142 may be coupled to a drain of the second SONOS transistor 132 and to a drain of fourth SONOS transistor 136. The first cell 120 and the second cell 122 may be located in the first row, and the third cell 124 and the fourth cell 126 may be located in the second row. For example, the first word line 144 may be coupled to a gate of the first SONOS transistor 130 and to a gate of the second SONOS transistor 132. In a similar manner, the second word line 146 may be coupled to a gate of the third SONOS transistor 134 and to a gate of the fourth SONOS transistor 136

The pre-programming analysis circuitry 110 may be configured to determine voltages that, when applied to the bit lines 140, 142 and to the word lines 144, 146 during a programming operation, cause voltage stresses associated with each "unselected" SONOS transistor 130, 132, 134, 136 to be substantially balanced. As used herein, the "voltage stress" associated with a particular SONOS transistor is indicative of the voltage difference between a gate and a drain of the particular SONOS transistor. A substantially large voltage stress may result in inadvertent programming of the particular SONOS transistor. Balancing the voltage stresses associated with each SONOS transistor unselected 130, 132, 134, 136 may reduce relatively large voltage stresses at the expense of relatively small voltage stresses during programming operations. As a non-limiting example, if the first SONOS transistor 130 would have a relatively large voltage stress during a programming operation and the second SONOS transistor 132 would have a relatively small voltage stress during the programming operations, voltages applied to the bit lines 140, 142 and to the word lines 144, 146 may be adjusted to reduce the voltage stress associated with first SONOS transistor 130 at the expense of increasing the voltage stress associated with the second SONOS transistor 132. Illustrative examples of balancing the voltage stresses are shown with respect to FIGS. 2A-2B.

During a pre-programming phase (e.g., a period where voltage is not applied to the bit lines 140, 142 and word lines 144, 146), the layout analysis circuitry 114 may be configured to analyze the SONOS flash memory array 106. For example, the layout analysis circuitry 114 may determine placement of the cells 120, 122, 124, 126, connections between the bit lines 140, 142 and the SONOS transistors 130, 132, 134, 136, connections between the word lines 144, 146 and the SONOS transistors 130, 132, 134, 136, etc. As described below, the layout analysis circuitry 114 may be configured to determine a circuit layout of the array of SONOS flash memory cells in FIGS. 2A-2B.

After the circuit layout of the SONOS flash memory array 106 is determined, the pre-programming analysis circuitry 110 may select a cell to be programmed and the voltage scheme selector 116 may select a voltage scheme (from a plurality of voltage schemes) to bias the bit lines 140, 142 and the word lines 144, 146. If the selected voltage scheme results in the unselected cells having substantially balanced voltage stresses, the selected voltage scheme may be used by the programming circuitry 112 during programming to program the selected cell. As a non-limiting example, the voltage scheme selector 116 may select a first voltage scheme 115 to program the selected cell or a second voltage scheme 117 to program the selected cell. Each voltage scheme 115, 117 may apply different voltages to the bit lines 140, 142 and the word lines 144, 146. Although two voltage schemes 115, 117 are illustrated, in other implementations, the voltage scheme selector 116 may select from additional voltage schemes (not shown).

To illustrate, the pre-programming analysis circuitry 110 may select the fourth cell 126 to be programmed, and the voltage scheme selector 116 may select the first voltage scheme 115 to bias the bit lines 140, 142 and the word lines 144, 146. The voltage stress determination circuitry 118 may analyze each voltage stress associated with the SONOS transistors 130, 132, 134 of the unselected cells 120, 122, 124 if the first voltage scheme 115 were to be implemented during programming.

To illustrate, the voltage stress determination circuitry 118 may determine a first voltage stress associated with the first SONOS transistor 130 if the particular cell (e.g., the fourth cell 126) is programmed according to the first voltage scheme 115. As a non-limiting example, the voltage stress determination circuitry 118 may determine the first voltage stress associated with the first SONOS transistor 130 is approximately −4.5V if the particular cell is programmed according to the first voltage scheme 115. The voltage stress determination circuitry 118 may determine a second voltage stress associated with the second SONOS transistor 132 if the particular cell is programmed according to the first voltage scheme 115. As a non-limiting example, the voltage stress determination circuitry 118 may determine the second voltage stress associated with the second SONOS transistor 132 is approximately 0V (e.g., no voltage stress) if the particular cell is programmed according to the first voltage scheme 115. The voltage stress determination circuitry 118 may determine a third voltage stress associated with the third SONOS transistor 134 if the particular cell is programmed according to the first voltage scheme 115. As a non-limiting example, the voltage stress determination circuitry 118 may determine the third voltage stress associated with the third SONOS transistor 134 is approximately 3V if the particular cell is programmed according to the first voltage scheme 115.

Thus, if the fourth cell 126 is to be programmed according to the first voltage scheme 115, the first SONOS transistor 130 may experience a relatively large amount of voltage stress (e.g., −4.5V) and the second SONOS transistor 132 may experience a relatively small amount of voltage stress (e.g., 0V). To balance the voltage stress associated with the SONOS transistors 130, 132, 134 of the unselected cell 120, 122, 124, the voltage scheme selector 116 may select the second voltage scheme 117 to bias the bit lines 140, 142 and the word lines 144, 146. The voltage stress determination circuitry 118 may analyze each voltage stress associated with the SONOS transistors 130, 132, 134 of the unselected cells 120, 122, 124 if the second voltage scheme 117 were to be implemented during programming.

To illustrate, the voltage stress determination circuitry 118 may determine the first voltage stress associated with the first SONOS transistor 130 if the particular cell (e.g., the fourth cell 126) is programmed according to the second voltage scheme 117. As a non-limiting example, the voltage stress determination circuitry 118 may determine the first voltage stress associated with the first SONOS transistor 130 is approximately −3V if the particular cell is programmed according to the second voltage scheme 117. The voltage stress determination circuitry 118 may determine the second voltage stress associated with the second SONOS transistor 132 if the particular cell is programmed according to the second voltage scheme 117. As a non-limiting example, the voltage stress determination circuitry 118 may determine the second voltage stress associated with the second SONOS transistor 132 is approximately 1.5V if the particular cell is programmed according to the second voltage scheme 117. The voltage stress determination circuitry 118 may determine the third voltage stress associated with the third SONOS transistor 134 if the particular cell is programmed according to the second voltage scheme 117. As a non-limiting example, the voltage stress determination circuitry 118 may determine the third voltage stress associated with the third SONOS transistor 134 is approximately 3V if the particular cell is programmed according to the second voltage scheme 117.

Thus, voltage stresses associated with the SONOS transistor 130, 132, 134 of the unselected cells 120, 122, 124 may be substantially balanced by utilizing the second voltage scheme 117 as opposed to the first voltage scheme 115. For example, the relatively large voltage stress (e.g., −4.5V) associated with the first SONOS transistor 130 in the first voltage scheme 115 may be reduced to a smaller voltage stress (e.g., −3V) in the second voltage scheme 117. The reduction in voltage stress at the first SONOS transistor 130 may be at the expense of the second SONOS transistor 132. For example, the second voltage stress may increase from 0V to 1.5V by selecting the second voltage scheme 117.

After the pre-programming analysis circuitry 110 determines that the second voltage scheme 117 substantially balances the voltage stresses associated with the SONOS transistors 130, 132, 134 of the unselected cells 120, 122, 124, the pre-programming analysis circuitry 110 may send an indication of the second voltage scheme 117 to the programming circuitry 112. The programming circuitry 112 may be configured to program the selected cell (e.g., the fourth cell 126) according to the second voltage scheme 117. For example, the programming circuitry 112 may bias the bit lines 140, 142 and the word lines 144, 146 according to the second voltage scheme 117 to program the fourth cell 126.

According to one implementation, the pre-programming analysis circuitry 110 may further reduce the program disturb of the unselected cells 120, 122, 124 by reducing the SONOS flash memory page size. Reducing the SONOS flash memory page size may reduce the amount of times that the unselected cells 120, 122, 124 are subject to voltage stress due to programming of another cell. As a result, sub-page program mode may be enabled for programming cells in the SONOS flash memory array 106. According to one implementation, the sub-page program mode includes byte program mode. According to another implementation, the sub-page program mode includes word program mode.

Thus, the system 100 may balance the voltage stress, and thus the program disturb, across the unselected cells 120, 122, 124 such that a single unselected cell does not experience excess voltage stress. It should be noted that "balancing the voltage stress" across the unselected cells 120, 122, 124 does not require the voltage stress across the unselected cells 120, 122, 124 to be equal. For example, balancing the voltage stress may include substantially reducing the difference between voltage stresses at different unselected cells 120, 122, 124, reducing the largest magnitude of voltage stress experienced by one of the unselected cells 120, 122, 124, or a combination thereof.

Figure 2A:
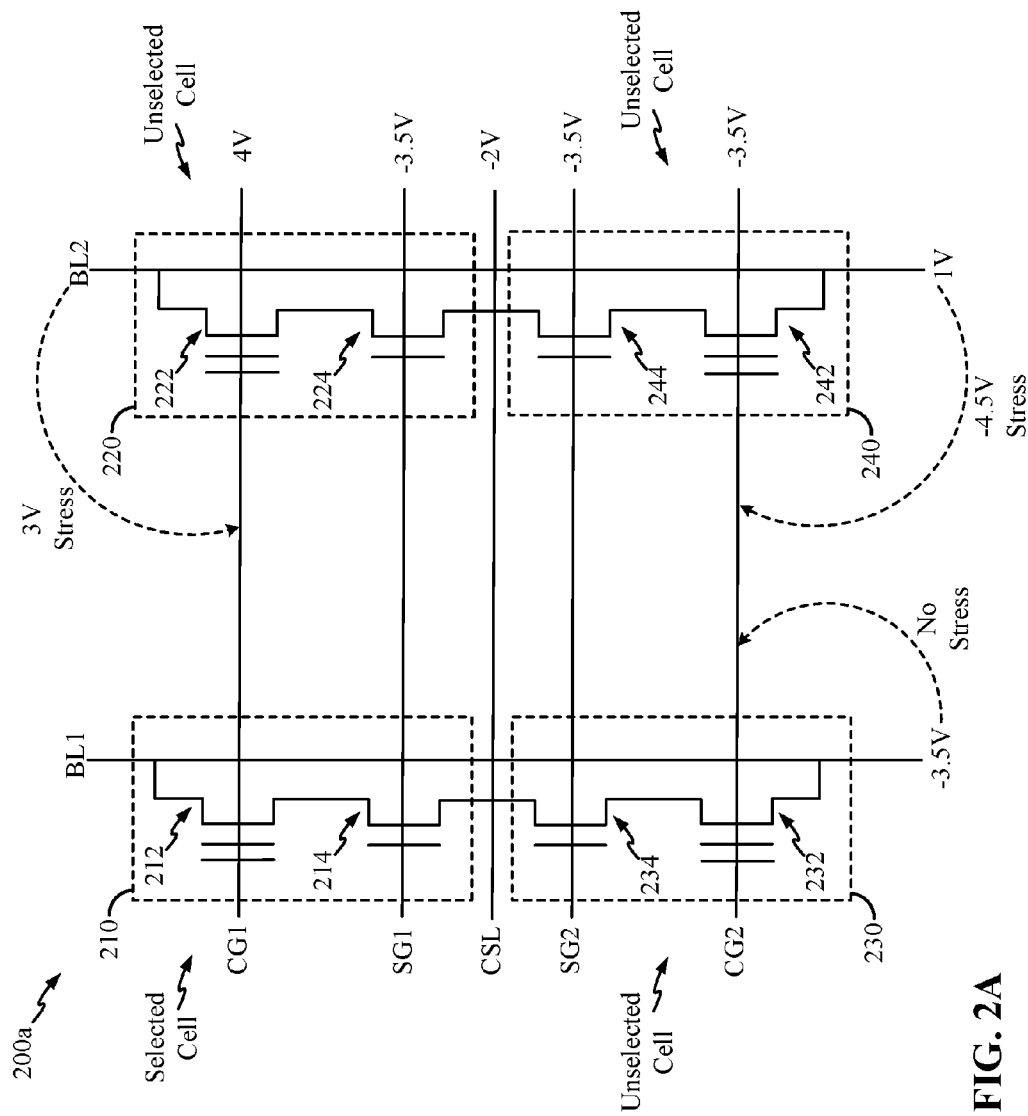
FIG. 2A illustrates a particular example of a first version of an array of SONOS flash memory cells.

Referring to FIG. 2A, a first version 200a of a program scheme for an array of SONOS flash memory cells is shown. According to one implementation, the array of SONOS flash memory cells may correspond to the SONOS flash memory array 106 of FIG. 1. As described below, the first version 200a of the array of SONOS flash memory cells is an "unbalanced" version of array of SONOS flash memory cells. For example, a first voltage scheme (e.g., the first voltage scheme 115 of FIG. 1) may be applied to generate the first version 200a of the array of SONOS flash memory cells.

The array includes a cell 210, a cell 220, a cell 230, and a cell 240. The cell 210 includes a SONOS transistor 212 and an access transistor 214, the cell 220 includes a SONOS transistor 222 and an access transistor 224, the cell 230 includes a SONOS transistor 232 and an access transistor 234, and the cell 240 includes a SONOS transistor 242 and an access transistor 244. A drain of the SONOS transistor 212 is coupled to a bit line (BL1), and a source of the SONOS transistor 212 is coupled to a drain of the access transistor 214. A source of the access transistor 214 is coupled to a source of the access transistor 234, and a drain of the access transistor 234 is coupled to a source of the SONOS transistor 232. A drain of the SONOS transistor 232 is coupled to the bit line (BL1). A drain of the SONOS transistor 222 is coupled to a bit line (BL2), and a source of the SONOS transistor 222 is coupled to a drain of the access transistor 224. A source of the access transistor 224 is coupled to a source of the access transistor 244, and a drain of the access transistor 244 is coupled to a source of the SONOS transistor 242. A drain of the SONOS transistor 242 is coupled to the bit line (BL2).

The SONOS transistors 212, 222 of the cells 210, 220, respectively, are coupled to a common gate line. For example, a gate of the SONOS transistor 212 is coupled to a control gate line (CG1), and a gate of the SONOS transistor 222 is coupled to the control gate line (CG1). The access transistors 214, 224 of the cells 210, 220, respectively, are coupled to a common gate line. For example, a gate of the access transistor 214 is coupled to a select gate line (SG1), and a gate of the access transistor 224 is coupled to the select gate line (SG1). The SONOS transistors 232, 242 of the cells 230, 240, respectively, are coupled to a common gate line. For example, a gate of the SONOS transistor 232 is coupled to a control gate line (CG2), and a gate of the SONOS transistor 242 is coupled to the control gate line (CG2). The access transistors 234, 244 of the cells 230, 240, respectively, are coupled to a common gate line. For example, a gate of the access transistor 234 is coupled to a select gate line (SG2), and a gate of the access transistor 244 is coupled to the select gate line (SG2). A control source line (CSL) is coupled to the sources of the access transistors 214, 224, 234, 244.

According to one implementation, the layout analysis circuitry 114 of FIG. 1 may determine the circuit layout described above. For example, the layout analysis circuitry 114 may determine the placement of the cells 210, 220, 230, 240, the connections between the bit lines (BL1, BL2) and the SONOS transistors 212, 222, 232, 242, connections between the control gate lines (CG1, CG2) and the SONOS transistors 212, 222, 232, 242, etc.

The pre-programming analysis circuitry 110 may select a cell for programming. As a non-limiting example, the pre-programming analysis circuitry 110 may select the cell 210 for programming. To illustrate, the cell 210 may be selected for programming and the other cells 220, 230, 240 may be unselected for programming operations. Prior to programming, the processor may determine voltages to be applied to the different bit lines and gate lines when the cell 210 is programmed. As a non-limiting example, the voltage scheme selector 116 may select a voltage scheme (e.g., the first voltage scheme 115). According to the first voltage scheme 115, 4V may be applied to the gate of the SONOS transistor 212 (via the control gate line (CG1)) and −3.5V may be applied to the drain of the SONOS transistor 212 to program the SONOS transistor 212. The voltage difference (e.g., 7.5V) between the gate and the drain of the SONOS transistor 212 may enable electrons from the source and drain of the SONOS transistor 212 to be trapped in a silicon nitride layer associated with the gate of the SONOS transistor 212. As a result, the cell 210 may be programmed to a logical "1" data value state.

The voltage stress determination circuitry 118 may determine the voltage stresses across the unselected cells. For example, although the cell 220 is not selected for programming operations, a 3V difference across the gate and the drain of the SONOS transistor 222 may be present if the cell 210 is programmed. For example, 4V may be applied to the gate of the SONOS transistor 222 and 1V may be applied to the drain of the SONOS transistor 222. Similarly, although the cell 240 is not selected for programming operations, a −4.5V difference across the gate and the drain of the SONOS transistor 242 may be present if the cell 210 is programmed. For example, −3.5V may be applied to the gate of the SONOS transistor 242 and 1V may be applied to the drain of the SONOS transistor 242. The voltage stress (e.g., voltage differences) across the unselected cells 220, 240 may cause program disturb. The cell 230 would not include any stress (e.g., no program disturb or low stress) because the voltage to be applied to the gate of the SONOS transistor 232 is equal (or similar) to the voltage to be applied to the drain of the SONOS transistor 232.

Because the cell 240 would include the highest amount of voltage stress, and thus the highest amount of potential program disturb, the processor may implement program disturb balancing techniques (prior to programming the cell 210) to balance the voltage stress across the unselected cells 220, 230, 240. Balancing the voltage stress across the unselected cells 220, 230, 240 may reduce program disturb associated with the array.

Figure 2B:
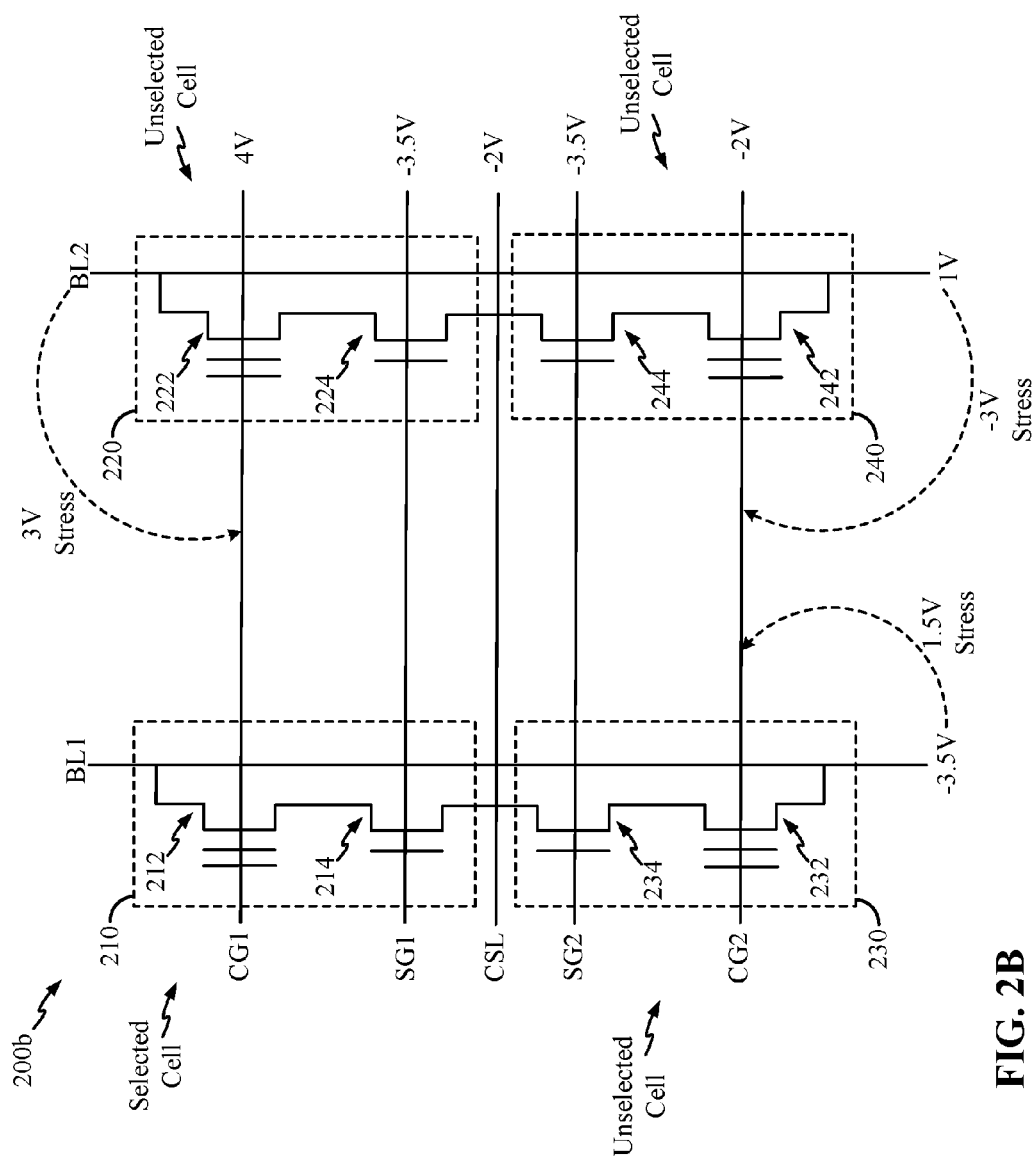
FIG. 2B illustrates a particular example of a second version of the SONOS flash memory cells.

For example, referring to FIG. 2B, a second version 200b of a program scheme for the array of SONOS flash memory cells is shown. As described below, the second version 200b of the array of SONOS flash memory cells is a "balanced" version of array of SONOS flash memory cells as compared to the first version 200a. For example, a second voltage scheme (e.g., the second voltage scheme 117 of FIG. 1) may be applied to generate the second version 200a of the program scheme for the array of SONOS flash memory cells.

According to the balanced version, the voltage stress across the cell 240 (e.g., the unselected cell with the highest amount of voltage stress) is reduced "at the expense of" the cell 230 (e.g., the unselected cell with the least amount of voltage stress). For example, instead of applying −3.5V to the gates of the SONOS transistors 232, 242 (via the control gate line (CG2)), a reduced magnitude voltage (e.g., −2V) is applied to the gates of the SONOS transistors 232, 242. As a result, a −3V difference across the gate and drain of the SONOS transistor 242 is present (as opposed to the −4.5V difference in the first version 200a), and the voltage stress at the SONOS transistor 232 is increased to 1.5V. Thus, the techniques described herein may balance the voltage stress, and thus the program disturb, across the unselected cells 220, 230, 240 such that a single unselected cell does not experience excess voltage stress. It should be noted that "balancing the voltage stress" across the unselected cells 220, 230, 240 does not require the voltage stress across the unselected cells 220, 230, 240 to be equal. For example, balancing the voltage stress may include substantially reducing the difference between voltage stresses at different unselected cells 220, 230, 240.

Figure 3:
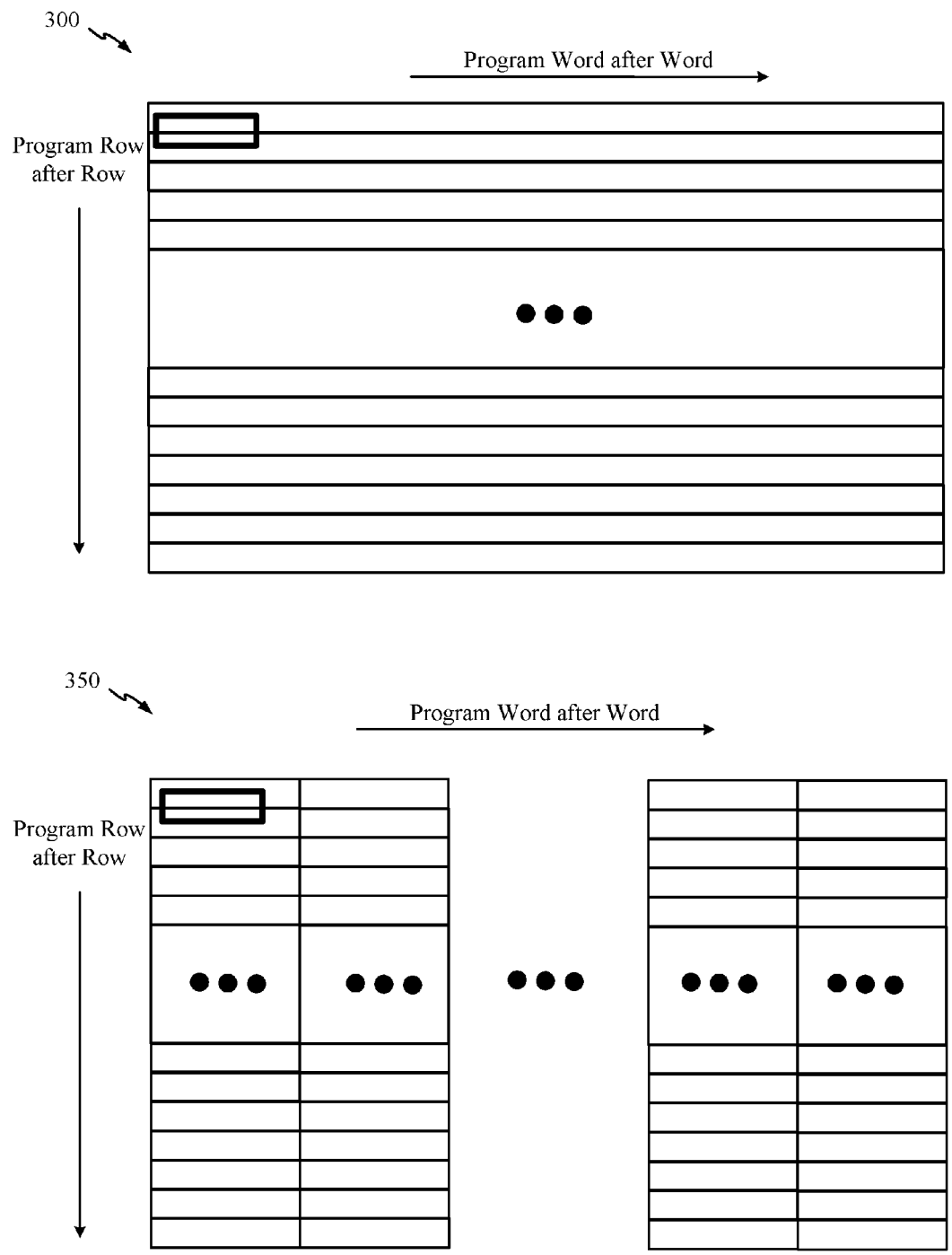
FIG. 3 illustrates an example of partitioning a SONOS flash memory array into sub-rows to enable sub-row (or sub-page) program mode.

FIG. 3 illustrates a first version 300 of a SONOS flash memory array. According to the first version 300, the SONOS flash memory array is programmed according to a page program mode. For example, the processor 104 may program the first version 300 of the SONOS flash memory array row by row. If the SONOS flash memory array is a 2 megabyte (MB) array with 256 rows, each row may include 8 kilobytes (KB) of data. The data (e.g., the bits) programmed to a logical one value at the beginning of the program operations may be subject to relatively high program disturb because the cells (e.g., the SONOS transistors) associated with the data experience voltage stress associated with the programming operations for the rest of the row.

To reduce program disturb, a second version 350 of the SONOS flash memory array may be generated. To generate the second version, the processor 104 may partition the SONOS flash memory array into multiple sections. Each section may include different cells. For example, the processor 104 may partition each row into sub-rows. The processor 104 may select a particular section (e.g., a particular sub-row) of the multiple sections to perform programming operations. According to one implementation, the particular section may include the cells 210, 220, 230, 240 described with respect to FIGS. 2A-2B. The processor 104 may perform programming operation on the particular section while bypassing programming operations on the other sections of the multiple sections. Program disturb may be reduced by reducing SONOS flash memory row size. The reduction in program disturb may enable sub-page (or sub-row) programming of the SONOS flash memory array. According to one implementation, the reduction in program disturb may enable byte programming of the SONOS flash memory array. According to another implementation, the reduction in program disturb may enable word programming of the SONOS flash memory array.

Thus, program disturb may also be reduced by dividing the array into multiple sections (e.g., multiple sub-blocks). For example, the array shown in FIGS. 2A-2B may be a sub-block of a larger SONOS flash memory array (e.g., the SONOS flash memory array shown in FIG. 3). The array may be used for data storage (e.g., electrically erasable programmable read-only memory (EEPROM) data storage), and the unselected sub-blocks may be used as code flash. The block assignment information may be saved as one-time programmable data. Thus, program disturb may be reduced at the unselected sub-blocks because the cells in the unselected sub-blocks may not be subject to programming operations.

Figure 4:
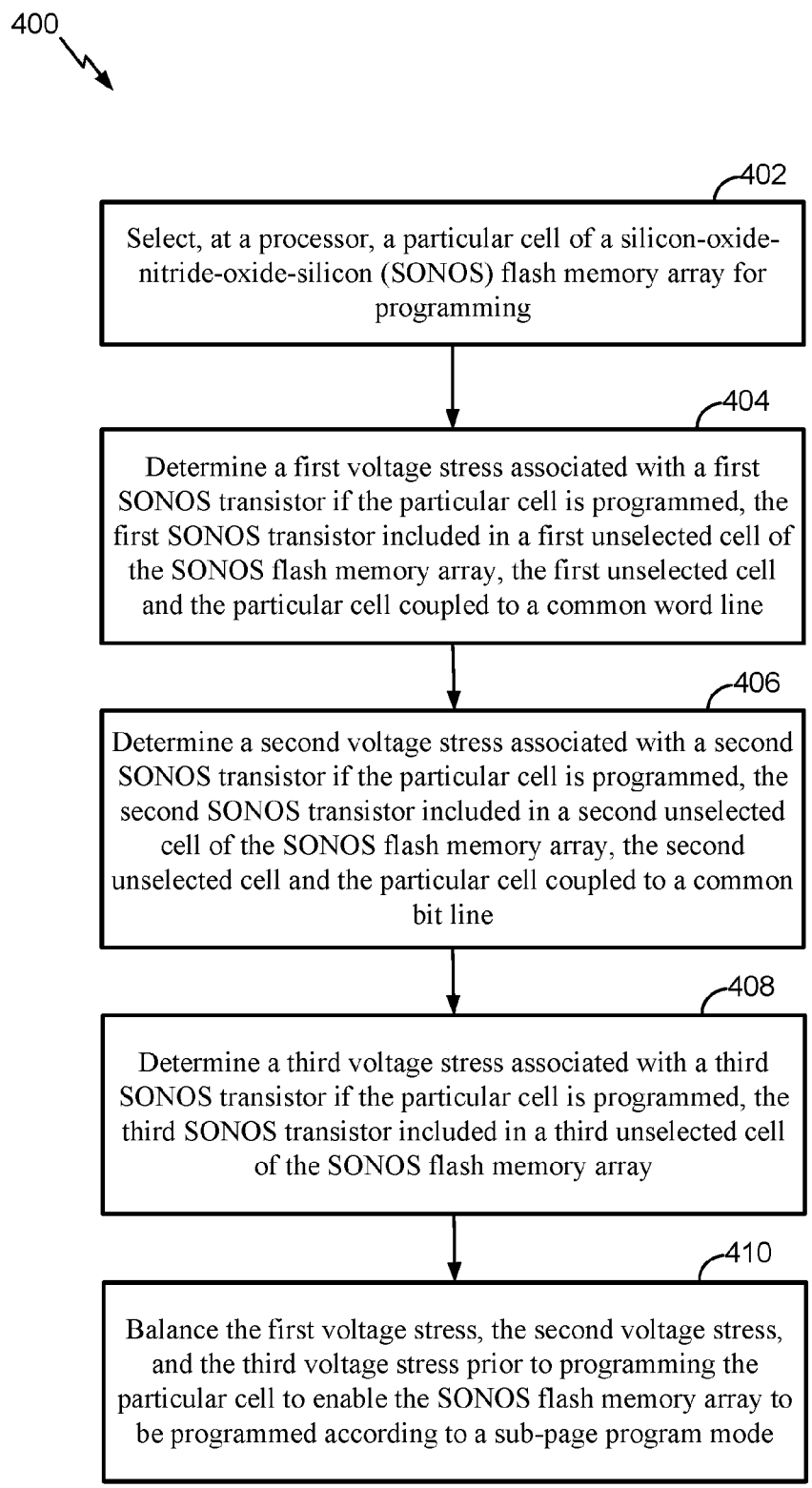
FIG. 4 illustrates a particular example of a method for balancing voltage stress at a SONOS flash memory.

Referring to FIG. 4, a method 400 for balancing voltage stress at a SONOS flash memory array is shown. The method 400 may be performed by the system 100 of FIG. 1. For example, the method 400 may be performed by the voltage scheme selector 116 of FIG. 1 and the voltage stress determination circuitry 118 of FIG. 1.

The method 400 includes selecting, at a processor, a particular cell of a SONOS flash memory array for programming, at 402. For example, referring to FIGS. 1-2A, the pre-programming analysis circuitry 110 may select the cell 210 for programming.

The method 400 also includes determining a first voltage stress associated with a first SONOS transistor if the particular cell is programmed, at 404. The first SONOS transistor may be included in a first unselected cell of the SONOS flash memory array, and the first unselected cell and the particular cell may be coupled to a common word line. For example, referring to FIGS. 1-2A, the voltage scheme selector 116 may apply the first voltage scheme 115 to the array of SONOS flash memory cells of FIG. 2A. The voltage stress determination circuitry 118 may determine the voltage stress associated with the SONOS transistor 222 is 3V according to the first voltage scheme 115 as depicted in FIG. 2A.

The method 400 also includes determining a second voltage stress associated with a second SONOS transistor if the particular cell is programmed, at 406. The second SONOS transistor may be included in a second unselected cell of the SONOS flash memory array, and the second unselected cell and the particular cell may be coupled to a common bit line. For example, referring to FIGS. 1-2A, the voltage stress determination circuitry 118 may determine the voltage stress associated with the SONOS transistor 232 is 0V according to the first voltage scheme 115 as depicted in FIG. 2A.

The method 400 also includes determining a third voltage stress associated with a third SONOS transistor if the particular cell is programmed, at 408. The third SONOS transistor may be included in a third unselected cell of the SONOS flash memory array. For example, referring to FIGS. 1-2A, the voltage stress determination circuitry 118 may determine the voltage stress associated with the SONOS transistor 242 is −4.5V according to the first voltage scheme 115 as depicted in FIG. 2A.

The method 400 also includes balancing first voltage stress, the second voltage stress, and the third voltage stress prior to programming the particular cell to enable the SONOS flash memory array to be programmed according to a sub-page program mode, at 410. For example, referring to FIGS. 1 and 2B, the voltage scheme selector 116 may apply the second voltage scheme 117 to the array of SONOS flash memory cells of FIG. 2B to balance the voltage stresses. Balancing the voltage stresses may include increasing at least one of the first voltage stress, the second voltage stress, or the third voltage stress. Balancing the voltage stresses may also include decreasing at least one other of the first voltage stress, the second voltage stress, or the third voltage stress. According to one implementation, the sub-page program mode may include a byte program mode. According to another implementation, the sub-page program mode may include a word program mode.

According to one implementation of the method 400, balancing the first voltage stress, the second voltage stress, and the third voltage stress may include adjusting a voltage to be applied to a bit line coupled to a gate of the third SONOS transistor during programming of the particular cell. The bit line may be further coupled to a gate of the second SONOS transistor. For example, referring to FIGS. 2A-2B, the voltage applied to the control gate line (CG2) may be adjusted from −3.5V to −2V. Adjusting the voltage applied to the control gate line (CG2) may reduce the third voltage stress associated with the SONOS transistor 242 at the expense of the second voltage stress associated with the SONOS transistor 232.

According to one implementation of the method 400, balancing the first voltage stress, the second voltage stress, and the third voltage stress may include increasing a first amount of program disturb associated with the first SONOS transistor or increasing a second amount of program disturb associated with the second SONOS transistor. For example, referring to FIGS. 2A-2B, balancing the first voltage stress, the second voltage stress, and the third voltage stress may include increasing a first amount of program disturb associated with the SONOS transistor 222 or increasing a second amount of program disturb associated with the SONOS transistor 232. Balancing the first voltage stress, the second voltage stress, and the third voltage stress according to the method 400 may also include decreasing a third amount of program disturb associated with the third SONOS transistor. For example, referring to FIGS. 2A-2B, balancing the first voltage stress, the second voltage stress, and the third voltage stress may include decreasing a third amount of program disturb associated with the SONOS transistor 242. Thus, the first amount of program disturb, the second amount of program disturb, and the third amount of program disturb may be closer to each other or substantially equal after balancing the first voltage stress, the second voltage stress, and the third voltage stress.

According to one implementation, the method 400 may also include partitioning the SONOS flash memory array into multiple sections. Each second may include different cells. The method 400 may also include selecting a particular section of the multiple sections to perform programming operations. The particular section may include the particular cell, the first unselected cell, the second unselected cell, and the third unselected cell. The method 400 may also include performing programming operations on the particular section while bypassing programming operations on the other sections of the multiple sections.

The method 400 of FIG. 4 may balance the voltage stress, and thus the program disturb, across the unselected cells 120, 122, 124 of FIG. 1 or the unselected cells 220, 230, 240 of FIG. 2 such that a single unselected cell does not experience excess voltage stress. It should be noted that "balancing the voltage stress" across the unselected cells 120, 122, 124, 220, 230, 240 does not require the voltage stress across the unselected cells 120, 122, 124, 220, 230, 240 to be equal. For example, balancing the voltage stress may include substantially reducing the difference between voltage stresses at different unselected cells 120, 122, 124, 220, 230, 240.

Figure 5:
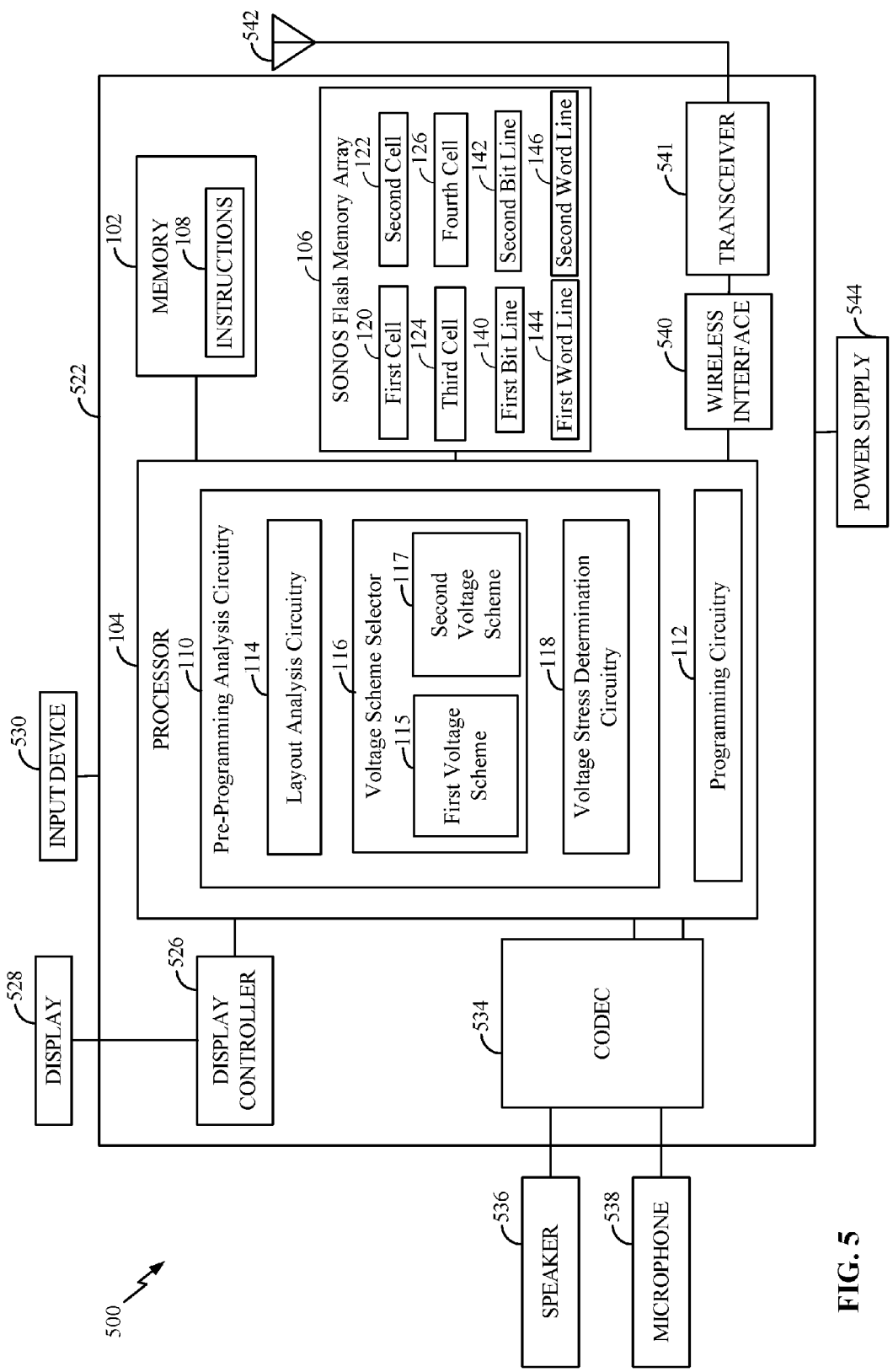
FIG. 5 illustrates a particular example of a diagram of a device that is operable to support various implementations of one or more methods, systems, apparatuses, and/or computer-readable media disclosed herein.

Referring to FIG. 5, a device 500 that is operable to balance voltage stress at a SONOS flash memory shown. The device 500 includes the processor 104, such as a digital signal processor or central processing unit, coupled to the memory 102 and to the SONOS flash memory array 106. The SONOS flash memory array 106 includes the first cell 120, the second cell 122, the third cell 124, the fourth cell 126, the first bit line 140, the second bit line 142, the first word line 144, and the second word line 146 of FIG. 1.

The processor 104 includes the pre-programming analysis circuitry 110 and the programming circuitry 112. The pre-programming analysis circuitry 110 includes the layout analysis circuitry 114, the voltage scheme selector 116, and the voltage stress determination circuitry 118. The processor 104 may be configured to execute software, such as a program of one or more instructions 108, stored in the memory 102. In some implementations, the processor 104 may be configured to operate in accordance with the method 400 of FIG. 4. For example, the processor 104 may balance voltage stress at the SONOS flash memory array 106.

A wireless interface 540 may be coupled to the processor 104 and to an antenna 542. For example, the wireless interface 540 may be coupled to the antenna 542 via a transceiver 541. A coder/decoder (CODEC) 534 can also be coupled to the processor 104. A speaker 536 and a microphone 538 can be coupled to the CODEC 534. A display controller 526 can be coupled to the processor 104 and to a display device 528. In a particular implementation, the memory 102, the processor 104, the SONOS flash memory array 106, the display controller 526, the CODEC 534, the wireless interface 540, and the transceiver 541 are included in a system-in-package or system-on-chip device 522. In a particular implementation, an input device 530 and a power supply 544 are coupled to the system-on-chip device 522.

Moreover, in a particular implementation, as illustrated in FIG. 5, the display device 528, the input device 530, the speaker 536, the microphone 538, the antenna 542, and the power supply 544 are external to the system-on-chip device 522. However, each of the display device 528, the input device 530, the speaker 536, the microphone 538, the antenna 542, and the power supply 544 can be coupled to one or more components of the system-on-chip device 522, such as one or more interfaces or controllers.

In conjunction with the described techniques, an apparatus includes means for selecting a particular cell of a SONOS flash memory array for programming. For example, the means for selecting may include the processor 104 of FIGS. 1 and 5, the pre-programming analysis circuitry 110 of FIGS. 1 and 5, the programming circuitry 112 of FIGS. 1 and 5, a processor programmed to execute the instructions 108 of FIGS. 1 and 5, one or more other devices, circuits, modules, or any combination thereof.

The apparatus may also include means for determining voltage stresses of unselected cells of the SONOS flash memory array. For example, the means for determining the voltage stresses may include the processor 104 of FIGS. 1 and 5, the pre-programming analysis circuitry 110 of FIGS. 1 and 5, the voltage stress determination circuitry 118 of FIGS. 1 and 5, a processor programmed to execute the instructions 108 of FIGS. 1 and 5, one or more other devices, circuits, modules, or any combination thereof.

The apparatus may also include means for selecting a voltage scheme among a plurality of voltage schemes to program the particular cell. For example, the means for selecting may include the processor 104 of FIGS. 1 and 5, the pre-programming analysis circuitry 110 of FIGS. 1 and 5, the voltage scheme selector 116 of FIGS. 1 and 5, a processor programmed to execute the instructions 108 of FIGS. 1 and 5, one or more other devices, circuits, modules, or any combination thereof.

Those of skill in the art would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient (or non-transitory) storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A method of balancing voltage stress at a silicon-oxide-nitride-oxide-silicon (SONOS) flash memory array, the method comprising:
   selecting, at a processor, a particular cell of the SONOS flash memory array for programming;
   determining a first voltage stress associated with a first SONOS transistor if the particular cell is programmed, the first SONOS transistor included in a first unselected cell of the SONOS flash memory array, the first unselected cell and the particular cell coupled to a common word line;
   determining a second voltage stress associated with a second SONOS transistor if the particular cell is programmed, the second SONOS transistor included in a second unselected cell of the SONOS flash memory array, the second unselected cell and the particular cell coupled to a common bit line; and
   balancing the first voltage stress and the second voltage stress prior to programming the particular cell.

2. The method of claim 1, further comprising:
   determining a third voltage stress associated with a third SONOS transistor if the particular cell is programmed, the third SONOS transistor included in a third unselected cell of the SONOS flash memory array; and
   balancing the third voltage stress with the first voltage stress and the second voltage stress prior to programming the particular cell.

3. The method of claim 2, wherein the balancing the first voltage stress, the second voltage stress, and the third voltage stress enables the SONOS flash memory array to be programmed according to a sub-page program mode.

4. The method of claim 3, wherein the sub-page program mode comprises a byte program mode.

5. The method of claim 3, wherein the sub-page program mode comprise a word program mode.

6. The method of claim 2, wherein balancing the first voltage stress, the second voltage stress, and the third voltage stress comprises adjusting a voltage to be applied to a bit line coupled to a gate of the third SONOS transistor during programming of the particular cell.

7. The method of claim 6, wherein the bit line is further coupled to a gate of the second SONOS transistor.

8. The method of claim 2, wherein balancing the first voltage stress, the second voltage stress, and the third voltage stress comprises:
   increasing a first amount of program disturb associated with the first SONOS transistor or increasing a second amount of program disturb associated with the second SONOS transistor; and
   decreasing a third amount of program disturb associated with the third SONOS transistor.

9. The method of claim 8, wherein the first amount of program disturb, the second amount of program disturb, and the third amount of program disturb are substantially equal after balancing the first voltage stress, the second voltage stress, and the third voltage stress.

10. The method of claim 2, wherein balancing the first voltage stress, the second voltage stress, and the third voltage stress comprises:
    increasing at least one of the first voltage stress, the second voltage stress, or the third voltage stress; and
    decreasing at least one other of the first voltage stress, the second voltage stress, or the third voltage stress.

11. The method of claim 2, further comprising:
    partitioning the SONOS flash memory array into multiple sections, each section including different cells;
    selecting a particular section of the multiple sections to perform programming operations, the particular section including the particular cell, the first unselected cell, the second unselected cell, and the third unselected cell; and
    performing programming operations on the particular section while bypassing programming operations on the other sections of the multiple sections.

12. An apparatus for balancing voltage stress at a silicon-oxide-nitride-oxide-silicon (SONOS) flash memory array, the apparatus comprising:
    a processor; and
    a memory storing instructions executable by the processor to perform operations comprising:
      selecting a particular cell of the SONOS flash memory array for programming;
      determining a first voltage stress associated with a first SONOS transistor if the particular cell is programmed, the first SONOS transistor included in a first unselected cell of the SONOS flash memory array, the first unselected cell and the particular cell coupled to a common word line;
      determining a second voltage stress associated with a second SONOS transistor if the particular cell is programmed, the second SONOS transistor included in a second unselected cell of the SONOS flash memory array, the second unselected cell and the particular cell coupled to a common bit line; and
      balancing the first voltage stress and the second voltage stress prior to programming the particular cell.

13. The apparatus of claim 12, wherein the operations further comprise:
    determining a third voltage stress associated with a third SONOS transistor if the particular cell is programmed, the third SONOS transistor included in a third unselected cell of the SONOS flash memory array; and
    balancing the third voltage stress with the first voltage stress and the second voltage stress prior to programming the particular cell.

14. The apparatus of claim 13, wherein the balancing the first voltage stress, the second voltage stress, and the third voltage stress enables the SONOS flash memory array to be programmed according to a sub-page program mode.

15. The apparatus of claim 14, wherein the sub-page program mode comprises a byte program mode.

16. The apparatus of claim 14, wherein the sub-page program mode comprise a word program mode.

17. The apparatus of claim 13, wherein balancing the first voltage stress, the second voltage stress, and the third voltage stress comprises adjusting a voltage to be applied to a bit line coupled to a gate of the third SONOS transistor during programming of the particular cell.

18. The apparatus of claim 15, wherein the bit line is further coupled to a gate of the second SONOS transistor.

19. An apparatus for balancing voltage stress at a silicon-oxide-nitride-oxide-silicon (SONOS) flash memory array, the apparatus comprising:
- means for selecting a particular cell of the SONOS flash memory array for programming;
- means for determining voltage stresses of unselected cells of the SONOS flash memory array; and
- means for selecting a voltage scheme among a plurality of voltage schemes to program the particular cell, the voltage scheme selected based the voltage stresses of the unselected cells.

20. The apparatus of claim 19, wherein the voltage scheme enables the SONOS flash memory array to be programmed according to a sub-page program mode.

\* \* \* \* \*